US008385468B2

(12) United States Patent
Karthaus et al.

(10) Patent No.: US 8,385,468 B2
(45) Date of Patent: Feb. 26, 2013

(54) ASYNCHRONOUS DELTA-SIGMA MODULATOR AND A METHOD FOR THE DELTA-SIGMA MODULATION OF AN INPUT SIGNAL

(75) Inventors: Udo Karthaus, Neu-Ulm (DE); Horst Wagner, Westerstetten (DE)

(73) Assignee: Ubidyne, Inc., Wilmington, DE (US)

( * ) Notice: Subject to any disclaimer, the term of this patent is extended or adjusted under 35 U.S.C. 154(b) by 553 days.

(21) Appl. No.: 12/566,071

(22) Filed: Sep. 24, 2009

(65) Prior Publication Data
US 2010/0074368 A1    Mar. 25, 2010

Related U.S. Application Data

(60) Provisional application No. 61/099,991, filed on Sep. 25, 2008.

(30) Foreign Application Priority Data

Sep. 25, 2008 (GB) .................... 0817575.4

(51) Int. Cl.
*H03C 1/46* (2006.01)
*H03D 1/24* (2006.01)
*H03K 9/10* (2006.01)
(52) U.S. Cl. ........ 375/300; 375/296; 375/320; 375/322; 375/349
(58) Field of Classification Search ............. 375/219, 375/222, 223, 240.26–240.27, 268, 271, 375/295, 298, 300, 302, 316, 320, 322, 324, 375/340; 332/100, 103, 106, 117, 149; 3/219, 3/222, 223, 240.26–240.27, 268, 271, 295, 3/298, 300, 302, 316, 320, 322, 324, 340
See application file for complete search history.

(56) References Cited

U.S. PATENT DOCUMENTS

| | | | |
|---|---|---|---|
| 4,929,906 A | 5/1990 | Voyce et al. | |
| 5,237,288 A | 8/1993 | Cleveland | |
| 5,469,114 A | 11/1995 | Saxena | |
| 6,256,482 B1 | 7/2001 | Raab | |
| 6,369,618 B1 * | 4/2002 | Bloodworth et al. | ......... 327/103 |

(Continued)

FOREIGN PATENT DOCUMENTS
EP    1965496    9/2008
WO    01/89081    11/2001

(Continued)

OTHER PUBLICATIONS

UK Search Report issued Dec. 5, 2008.

*Primary Examiner* — Sam K Ahn
*Assistant Examiner* — Linda Wong
(74) *Attorney, Agent, or Firm* — Stephen H. Eland; Dann, Dorfman, Herrell & Skillman

(57) ABSTRACT

An asynchronous delta-sigma modulator is proposed that comprises an input port, a filter, an envelope path, a phase path, an amplifier, and a feedback path that conveys the amplifier output signal to the filter. The envelope path extracts an envelope from the signal provided by the filter and issues an envelope signal. The phase path processes or processes a phase from the signal provided by the filter and issues a phase signal. The amplifier comprises input ports for the envelope signal and the phase signal. The amplifier issues an amplifier output signal based on said envelope signal and said phase signal. The feedback path conveys the amplifier output signal to the filter. The feedback signal contains both amplitude information and phase information. A corresponding method and computer-program products usable for production and operation of the delta-sigma modulator are also disclosed.

16 Claims, 4 Drawing Sheets

U.S. PATENT DOCUMENTS

| | | |
|---|---|---|
| 6,788,151 B2 | 9/2004 | Shvarts et al. |
| 7,068,096 B2 | 6/2006 | Chu |
| 7,116,946 B2 | 10/2006 | Tanabe et al. |
| 7,400,865 B2 | 7/2008 | Jarvinen |
| 7,509,102 B2 * | 3/2009 | Rofougaran et al. ...... 455/127.1 |
| 7,579,922 B2 * | 8/2009 | Jensen et al. .................. 332/128 |
| 2007/0085717 A1 | 4/2007 | Pedersen et al. |
| 2008/0048898 A1 | 2/2008 | Miller et al. |
| 2008/0068240 A1 * | 3/2008 | Matsuura ..................... 341/143 |

FOREIGN PATENT DOCUMENTS

| | | |
|---|---|---|
| WO | 03/056701 | 7/2003 |
| WO | 2004/010283 | 1/2004 |
| WO | 2005/119904 | 12/2005 |
| WO | 2007/064007 | 6/2007 |
| WO | 2007/120281 | 10/2007 |
| WO | WO 2007120281 A2 * | 10/2007 |

* cited by examiner

ASYNCHRONOUS DELTA-SIGMA MODULATOR AND A METHOD FOR THE DELTA-SIGMA MODULATION OF AN INPUT SIGNAL

CROSS-REFERENCE TO RELATED APPLICATIONS

This application claims the priority of U.S. Provisional Application No. 61/099,991 and UK Patent Application GB 0817575.4, both filed on Sep. 25, 2008. The entire disclosure of the foregoing applications is incorporated herein by reference.

FIELD OF THE INVENTION

The field of the present application generally relates to an asynchronous delta-sigma modulator and in particular to an asynchronous delta-sigma modulator used in wireless radio frequency communication. The field of the application also relates to a computer-program product useable for the manufacture of the asynchronous delta-sigma modulator. The field of the application further relates to a method for asynchronous delta-sigma modulation and to a computer-program product enabling a processor to carry out the method for asynchronous delta-sigma modulation.

BACKGROUND OF THE INVENTION

One of the tasks when designing radio frequency transmitters is to transmit a signal with a relatively high bandwidth (e.g. 35 MHz) and a relatively high peak-to-average ratio (PAR, e.g. 7 dB) with high power efficiency, good linearity and/or good adjacent channel power ratio (ACPR). The design of the power amplification stage of the transmitter has a large influence on these criteria.

Class AB amplifiers with adaptive digital pre-distortion are able to meet the requirements regarding bandwidth, peak-to-average ratio, linearity and adjacent channel power ratio. However, they do not have a good efficiency. Any kind of linear amplifier (class A, class AB) have low efficiency due high quiescent currents.

The same is basically true for Doherty-amplifiers with adaptive digital pre-distortion.

Two other classes of amplifiers are class E amplifiers and class F amplifiers. Although these types of amplifiers are usually considered very efficient, this is only true for carrier wave signals which have a low PAR. The reason for this is that class E and class F amplifiers are matched to the frequency of the carrier signal.

Polar transmitters, also called envelope-elimination and restoration (EER) transmitters are sufficiently efficient, but their bandwidth and linearity are rather poor. EER transmitters function as follows: An input signal in IQ quadrature representation is converted to polar representation (amplitude and phase). Amplitude and phase data are separated for further processing. Polar transmitters use carrier wave signals to drive class-E or class-F power amplifiers by modulating supply power or power amplifier input signals. To this end, the amplitude data are typically delta-sigma modulated or pulse-width modulated. Modulating the supply voltage of the power amplifier could be done by controlling a DC-to-DC converter in accordance with the modulated amplitude signal. It is also possible to switch the supply voltage between different supply voltages, e.g. VDD, VDD/2, and 0. EER transmitters usually have very limited bandwidth and linearity. Linearity is very sensitive to:

delay mismatch between the amplitude path and the phase path
bandwidth of the amplitude path and the phase path
conversion from amplitude modulation (AM) to pulse modulation (PM).

EER is non-linear, because $1^{st}$ and higher order mixing products are created in the process of recombining the phase information and the amplitude information. the following formulas illustrate this.

$$z(t) = a(t) \cdot \exp(j \cdot \varphi(t))$$
$$= (a_{wanted}(t) + a_{error}(t)) \cdot \exp(j \cdot (\varphi_{wanted}(t) + \varphi_{error}(t)))$$
$$= (a_{wanted}(t) + a_{error}(t)) \cdot \exp(j \cdot \varphi_{wanted}(t)) \cdot \exp(j \cdot \varphi_{error}(t))$$
$$\approx (a_{wanted}(t) + a_{error}(t)) \cdot \exp(j \cdot \varphi_{wanted}(t))$$
$$\left(1 + j \cdot \varphi_{error}(t) - \frac{1}{2}\varphi_{error}^2(t) - \ldots \right)$$
$$= z_{wanted}(t) + z_{wanted}(t) \cdot j \cdot \varphi_{error}(t) + a_{error}(t) \cdot \exp(j \cdot \varphi_{wanted}(t)) +$$
$$a_{error}(t) \cdot \exp(j \cdot \varphi_{wanted}(t)) \cdot j \cdot \varphi_{error}(t) + \ldots ( ) \cdot \varphi_{error}^2(t)$$

wherein z(t) is the input signal, a(t) is the amplitude information and φ(t) is the phase information. As can be seen in the above equation, besides the wanted signal $z_{wanted}(t)$, the $1^{st}$ order mixing products $$z_{wanted}(t) \cdot j \cdot \phi_{error}(t) + a_{error}(t) \cdot \exp(j \cdot \phi_{wanted}(t))$$

and the second order mixing products $$a_{error}(t) \cdot \exp(j \cdot \phi_{wanted}(t)) \cdot j \cdot \phi_{error}(t) + \ldots ( ) \cdot \phi_{error}^2(t)$$

occur. Normal EER treats $a_{error}(t)$ and $\phi_{error}(t)$ separately and cannot correct for $1^{st}$ and $2^{nd}$ order mixed errors.

WO 2007/064007 A1, the entire disclosure of which being hereby incorporated by reference into the description, describes an EER transmitter with analogue feedback loops for phase and amplitude. The analogue feedback corrects for distortion, such as compression and AM-PM conversion, that may occur in the power amplifier. However, the problem with separate feedback loops for amplitude and phase is that the complex (I+jQ) signal is a linear function of I and Q, but not of phase and amplitude. Out of band errors of phase and amplitude are noise shaped and therefore have most energy out of band. When the phase and amplitude errors mix with each other due to non-linearities, in-band errors are generated that cannot be corrected. Also, a difference in delay in the amplitude and phase paths cannot be detected with the two loops being separate from each other. The entire disclosure of WO 2007/064007 is hereby incorporated into the description by reference.

U.S. Pat. Nos. 4,929,906 (issued to Voyce, assigned to The Boeing Company), 5,237,288 (issued to Cleveland, assigned to SEA, Inc.), and 5,469,114 (issued to Saxena, assigned to Advanced Milliwave Laboratories) disclose feedback circuits for the linearization of a power amplifier. The '288 patent and the '114 patent disclose a phase correction circuit in the feedback loop. However, none of the three U.S. Pat. No. 4,929,906, U.S. Pat. No. 5,237,288, and U.S. Pat. No. 5,469,114 discloses a delta-sigma modulator or envelope-elimination and restoration. The entire disclosure of the U.S. Pat. No. 4,929,906, U.S. Pat. No. 5,237,288, and U.S. Pat. No. 5,469,114 is hereby incorporated into the description by reference.

U.S. Pat. Nos. 6,256,482 (issued to Raab), 7,068,096 (issued to Chu, assigned to Northrop Grumman Corporation), and 7,400,865 (issued to Järvinen, assigned to Nokia Corporation) disclose EER transmitters. However, none of the three U.S. Pat. No. 6,256,482, U.S. Pat. No. 7,068,096, and U.S. Pat. No. 7,400,865 discloses a delta-sigma modulator. The '096 patent discloses a feedback control loop but this feedback control loop is internal to the EER modulator. The entire disclosure of the U.S. Pat. No. 6,256,482, U.S. Pat. No. 7,068,096, and U.S. Pat. No. 7,400,865 is hereby incorporated into the description by reference.

SUMMARY OF THE INVENTION

It would be desirable to provide a transmitter that has a high bandwidth, a high peak-to-average ratio, good linearity along with satisfactory efficiency. To this end, the transmitter substantially exhibits the structure of an asynchronous delta-sigma modulator. To better address this concern and/or other concerns, such an asynchronous delta-sigma modulator comprises an input port for receiving an input signal, a filter that receives the input signal from the input port and issues a filtered signal, an envelope (processing) path that extracts an envelope from the filtered signal and issues an envelope path, a phase (processing) path that processes a phase from the filtered signal and issues a phase signal, and an amplifier that comprises an envelope input port for the envelope signal and a phase input port for the phase signal. The amplifier issues an amplifier output signal based on the envelope signal and the phase signal. The asynchronous delta-sigma modulator also comprises a feedback path for the amplifier output signal to the filter.

Envelope elimination and restoration (EER) appears to have a strong potential for high efficiency. The proposed architecture allows the combination of class E amplifiers or class F amplifiers with efficient DC-DC converters/supply modules. The proposed architecture overcomes limitations regarding linearity and bandwidth. The DSM treats $z_{error}(t)$ as one complex error, including any mix product, and can correct for it.

The proposed delta-sigma modulator is expected to have high power efficiency due to a quasi-periodic amplifier input signal, i.e. the phase signal. Therefore, highly efficient class-E or class-F power amplifiers can be used. The DSM is also expected to have high bandwidth and good linearity due to analogue real-time feedback. Even complex errors like delay mismatch between AM and PM branches, AM to PM conversion, . . . , not detectable with separate feedback branches for phase and amplitude, can be detected and corrected. Another point to mention is lower filter loss (i.e. higher overall efficiency) compared to other (1-bit) DSM based solutions, because less quantization is done (no quantization of phase; higher resolution (2-bit or 3-bit) quantization for amplitude), if at all. The processing performed within or by the phase path may comprise an extraction of the phase signal.

It would be further desirable to achieve further improvement of power efficiency. In a further variant of an asynchronous delta-sigma modulator, this concern is addressed by the envelope processing path comprising a supply voltage modulator that provides a supply voltage for the amplifier. The amplifier, especially when it is a power amplifier, is one of the components that consume most of the power in the asynchronous delta-sigma modulator. Therefore, optimizing the efficiency of the amplifier has a non negligible impact on the overall efficiency of the asynchronous delta-sigma modulator. Adjusting the supply voltage of the amplifier facilitates that the power amplifier works in an optimal operating range. Adjusting the supply voltage for the amplifier can be done in an energy-efficient manner.

It would be further desirable to achieve an asynchronous delta-sigma modulator that features a supply voltage modulation that is well adapted to the required specifications of the envelope path. In a further variant of an asynchronous delta-sigma modulator, this concern is addressed by the supply voltage modulator comprising one or more selected from the group consisting of:
  a plurality of switches connected to different supply voltage levels,
  a pulse-width modulated DC-to-DC converter,
  a pulse-width modulator connected directly to the amplifier,
  a delta-sigma modulator connected directly to the amplifier,
  a delta-sigma modulated DC-to-DC converter,
  a DC-to-DC converter having a plurality of switches connected to a master supply voltage, wherein the switches are switched according to a cycling switching priority schedule.

It would be further desirable to achieve an asynchronous delta-sigma modulator that integrates parts of the envelope processing path with the amplifier for simpler circuit structure and/or further improvement of power efficiency. In a further variant of an asynchronous delta-sigma modulator, this concern is addressed by the amplifier comprising a plurality of transistors connected to different source voltages and a control logic that receives the envelope signal from the envelope processing path and switches a selected transistor among the plurality of transistors so that the amplifier output signal has an instantaneous amplitude that substantially corresponds to an instantaneous value of the envelope signal. The term "corresponds" also encompasses a linear or non-linear scaling between the envelope signal and the amplifier output signal. Since the amplifier output voltage can assume discrete values, only, the amplifier output signal assumes the value that is closest to the true corresponding value.

It would be further desirable to achieve an asynchronous delta-sigma modulator that makes use of the advantages of certain amplifier structures. In a further variant of an asynchronous delta-sigma modulator, this concern is addressed by the amplifier comprising a class-C amplifier, a class-D amplifier, a class-E amplifier, or a class-F amplifier.

It would further desirable to achieve an asynchronous delta-sigma modulator that makes use of the advantages of certain circuit types in the phase path. In a further variant of an asynchronous delta-sigma modulator, this concern is addressed by the phase processing path comprising one or more selected from the group consisting of:
  a hard limiting amplifier;
  a soft limiting amplifier;
  a voltage controlled oscillator;
  a linear amplifier;
  a pre-distorter compensating for non-linear behaviour of the amplifier and/or the supply modulator.

In the case of a voltage controlled oscillator, this voltage controlled oscillator may be injection-locked or phase-locked. In the case of a linear amplifier, the linear amplifier may be combined with an envelope tracking circuit. The linear amplifier in the phase path preserves the amplitude information. The envelope tracking circuit varies the drain supply voltage to the radio frequency power amplifier with respect to the average power contained in the input RF signal. This is done to ensure that the power amplifier has sufficient power at its disposal to correctly amplify the signal, i.e. substantially without going into saturation and to reduce supply voltage when less output power is needed, in order to save supply power. One of the purposes of envelope tracking is improved power efficiency of the power amplifier.

It would be further desirable to achieve an asynchronous delta-sigma modulator that compensates for different delays in the amplitude path and the phase path so that the amplifier is controlled by corresponding phase and amplitude signals. Doing so is expected to be beneficial to the performance of the delta-sigma modulator. In a further variant of an asynchronous delta-sigma modulator, this concern is addressed by the phase path comprising a phase signal delay element. Usually the delay of the amplitude path is greater than the delay of the phase path.

It would be further desirable to achieve an asynchronous delta-sigma modulator in which the summation of the input signal and the feedback amplifier output signal is performed in a simple manner and adapted to analogue signals. In a further variant of an asynchronous delta-sigma modulator, this concern is addressed by the filter comprising a voltage-to-current converter for converting the feedback amplifier output signal from a voltage representation to a current representation. A current representation of two signals facilitates adding the two signals by merging the two currents at a node of a network and using the sum current. If a conversion from voltage representation to current representation is needed, this can be achieved by a resistor, a capacitor or a transconductance stage.

It would be further desirable to achieve an asynchronous delta-sigma modulator that is adjusted to the frequency range of the input signal and/or the amplifier output signal. In a further variant of an asynchronous delta-sigma modulator this concern is addressed by a delay element for delaying the filtered signal. The delay element assures that the feedback signal has a certain desired phase relation with the input signal.

It would be further desirable to achieve an asynchronous delta-sigma modulator that is capable of driving a load, such as an antenna or a laser diode. In a further variant of an asynchronous delta-sigma modulator this concern is addressed by the amplifier being a power amplifier.

In a further aspect, it would be desirable to provide a radio frequency transmitter circuit that has some or all of the advantages of an asynchronous delta-sigma modulator as described above. This concern and/or other concerns are addressed by a radio-frequency transmitter circuit that comprises an asynchronous delta-sigma modulator as mentioned above.

In yet a further aspect a computer program product is proposed that is embodied on a computer readable medium and comprises executable instructions for the manufacture of the above mentioned asynchronous delta-sigma modulator.

It would further be desirable to provide a method of asynchronous delta-sigma modulation offering a high bandwidth, a high peak-to-average ratio, good linearity and satisfactory efficiency. To better address this concern and/or other concerns, such a method for asynchronous delta-sigma modulation comprises receiving the input signal, filtering the input signal with a filter to obtain a filtered signal, extracting an envelope from the filtered signal to obtain an envelope signal, processing a phase from the filtered signal to obtain a phase signal, supplying the envelope signal to an envelope input port of an amplifier and the phase signal to an phase input port of said amplifier, issuing an amplifier output signal based on said envelope signal and said phase signal, and feeding the amplifier output signal back to the filter.

Referring to the remarks made above in the context of an asynchronous delta-sigma modulator, an envelope input port of the amplifier may be a supply voltage input port for the amplifier. Supplying the envelope signal to the supply voltage port may comprise modulating the envelope signal to obtain a supply voltage for the amplifier.

Furthermore, modulating the envelope signal to obtain the supply voltage for the amplifier may comprise one or more selected from the group consisting of:

selecting a supply voltage level out of a plurality of supply voltage levels and connecting the supply voltage level to the supply voltage port of the amplifier, pulse-width modulating the envelope signal (ENVD), delta-sigma modulating the envelope signal (ENV), DC-to-DC converting the envelope signal by means of a plurality of switches connected to a master supply voltage, wherein the switches are switched according to a cycling priority schedule.

It may also be envisages that extracting the phase may comprise one or more selected from the group consisting of: hard limited amplifying the filtered signal, soft limited amplifying the filtered signal, employing a voltage controlled oscillator, linearly amplifying the filtered signal, pre-distorting the filtered signal.

In a further aspect, a computer program product is proposed that comprises instructions that enable a processor to carry out the asynchronous delta-sigma modulation method described above.

These and other aspects of what is taught herein will be apparent from and elucidated with reference to the embodiment(s) described herein after.

DETAILED DESCRIPTION OF THE EMBODIMENTS

For a complete understanding of the teachings of the present application and the advantages thereof, reference is now made to the following detailed description taken in conjunction with the Figures.

It should be appreciated that the various aspects of what is taught herein are merely illustrative of the specific ways to make and use the disclosed apparatus, method or computer-program product and do not therefore limit the scope of what is taught when taken into consideration with the claims and the following detailed description. It will also be appreciated that features from one embodiment of the disclosed apparatus, method or computer-program product may be combined with features from another embodiment.

Figure 1:
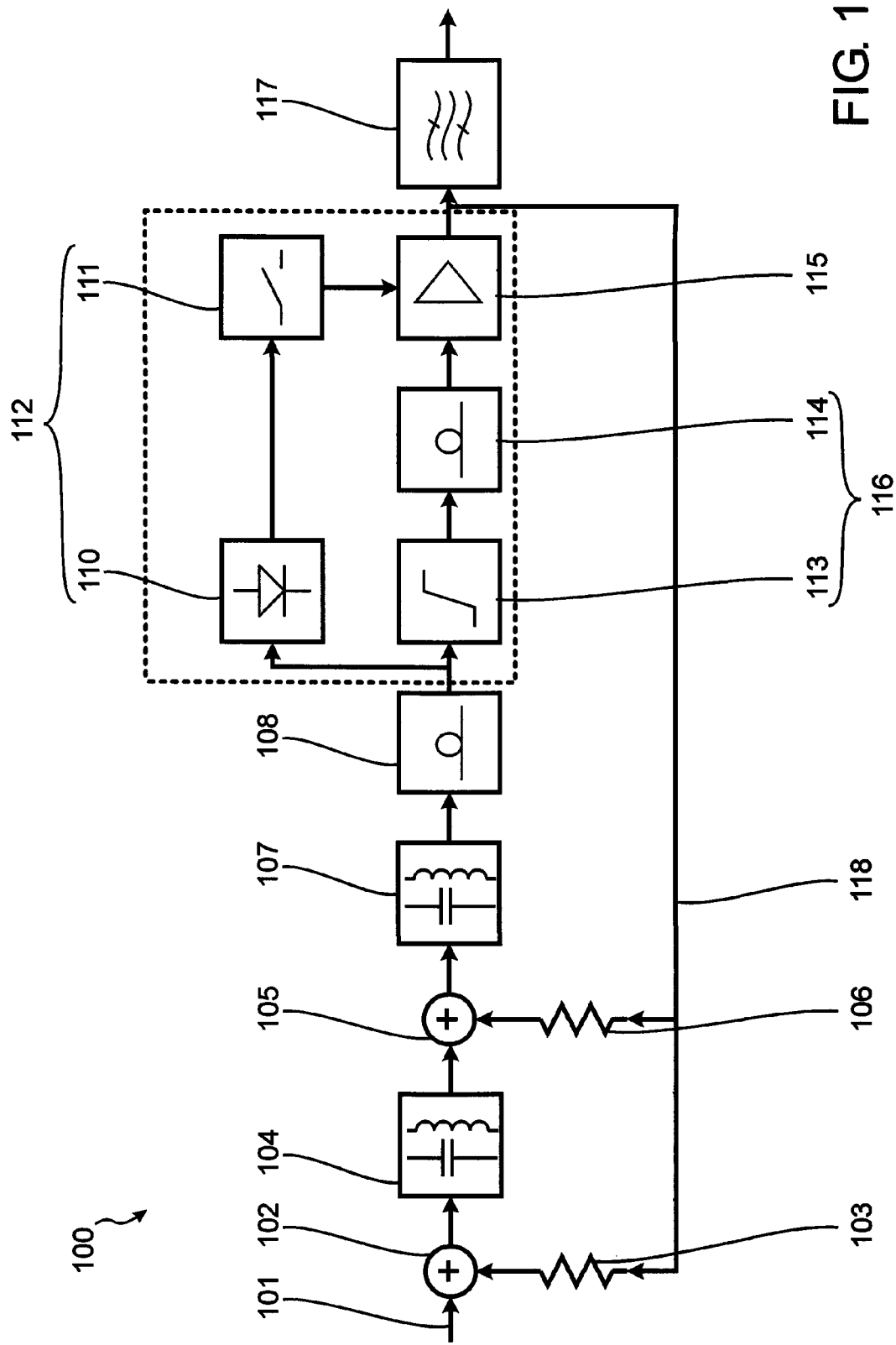
FIG. 1 shows a schematic block diagram of an asynchronous delta-sigma modulator implementing the principal teachings disclosed herein.

FIG. 1 shows an asynchronous delta-sigma modulator 100. An asynchronous delta-sigma modulator is a clockless continuous time delta-sigma modulator that receives an input signal at its input port 101. The input signal is typically analogue, but it is also possible to provide a digital input signal to the input port 101 of delta-sigma modulator 100. The input port 101 is connected to a summing element 102. Another summand for the summing element 102 is provided by a feedback loop 118. It should be noted that delta-sigma modulators calculate the difference between the input signal and the output signal, hence the expression "delta" in "delta-sigma modulator". However, when dealing with periodical signals, it is possible to perform a subtraction by shifting one of the two summand signals by a certain phase, and then adding the two signals. The feedback signal is usually delayed in comparison to the input signal so that a part of the phase shift is already accomplished by the delay.

The sum signal issued by the summing element 102 is passed on to a first filter stage or resonator 104. Filter stage 104 is usually an inductor-capacitor network or a tank having a specific resonance frequency and a specific quality factor. It is common to drive the first filter stage 104 with an electrical current as the filter input signal and to obtain an electrical voltage as the filter response of the first filter stage. Accordingly, transfer function between the filter input current and filter output voltage is used in order to obtain the filtering characteristic.

The signal filtered by the first filter stage is passed to a second summing element 105 which adds another feedback signal from feedback loop 118. FIG. 1 shows a $4^{th}$ order delta-sigma modulator as an example. The delta-sigma modulator could be of $2^{nd}$ order, $6^{th}$ or even higher order, as well. The output of summing element 105 continues to a second filter stage 107, similar to first filter stage 104, but possibly having different parameters. A delay element 108 delays the filter output signal of the second filter stage 107. As mentioned above, deliberately delaying the signal in the forward path of the delta-sigma modulator, and thus the output signal and the feedback signal of the delta-sigma modulator, may be useful for subtracting the feedback signal from the input signal. Preferably, delay element 108 is adjustable, which ensures that the feedback pulses can be phase adjusted with the signals in the resonators 104 and 107 to obtain optimum stability and noise shaping. Note however that the delay element is nevertheless optional.

The delayed signal is then passed on to the elements that are illustrated within the dashed box in FIG. 1. The dashed box shows an upper signal processing path and a lower signal processing path. The upper processing path is the envelope path 112 and comprises, in the variant depicted in FIG. 1, a peak detector 110 and a modulator 111. The peak detector 110 extracts the peaks of a quasi-periodical signal and converts it to a signal the represents the envelope of the signal. The supply voltage modulator 111 uses the envelope signal and deducts a modulated signal. Depending on the type of modulation that is employed, such a modulated signal is well suited for driving power electronics in an efficient manner. The supply voltage modulator produces a supply voltage for an amplifier 115. The supply voltage corresponds substantially and possibly up to a scaling factor to the envelope signal. The efficiency of the supply voltage modulator 111 is preferably around 80% or higher and it is expected that this can be achieved and even surpassed. It would be desirable if the supply voltage modulator 111 has a sufficiently high bandwidth and does not introduce too much delay to the amplitude signal path. A long delay could impair the stability and bandwidth of the entire asynchronous delta-sigma modulator 100. Simulation results have shown that a total loop delay of less than 1 ns is feasible.

The lower path in the dashed box in FIG. 1 is the phase path 116 which comprises a phase extraction circuit 113 and a delay element 114. The phase extraction circuit 113 can be a limiting amplifier. The delay element 114 makes sure that the output signal of the phase path 116 arrives substantially at the same at the amplifier 115 as the output signal of the envelope path 112. However, delay element 114 may be optional. In contrast to polar transmitters, delaying the phase signal might not be needed in the present configuration due to the complex (RF) feedback. (intermodulation, . . . ).

The amplifier 115 receives the phase signal as the signal to be amplified. Amplifier 115 can be a class E amplifier or a class F amplifier. At the same time, the supply voltage for amplifier 115 is constantly modified in accordance with the envelope signal. The amplifier output signal thus contains both the phase information and the amplitude information. Separating the phase input from the amplitude input of the amplifier makes it possible that the amplifier can be operated in a highly efficient mode. The amplifier is expected to achieve average efficiencies between 60% and 70%. For example, in the case of a field effect transistor, the field effect transistor can be switched on and off completely because the desired voltage value is already set by the supply voltage modulator.

The amplifier 115 produces an amplifier output signal that is provided to an output port of the asynchronous delta-sigma modulator 100. A band pass filter 117 is connected downstream of delta-sigma modulator 100 in order to suppress signal portions in unwanted frequency ranges. It is expected that the filter requirements for band pass filter 117 are not as stringent as for those filters used with known delta-sigma modulators. One of the reasons is that band pass filter 117 only needs to remove the shaped EER non-linearity error, but no or only little quantization noise which is predominant in the output signal of a known delta-sigma modulators. Quantization noise is rather low, if present at all, since the phase is analogue (no quantization at all), and the amplifier supply modulation may have a relatively high resolution (e.g. 2 . . . 3-bit, corresponding to 4 . . . 8-level) compared to standard 1-bit DSMs.

The amplifier output signal is also used as a feedback signal to the summing elements 102 and 105. If a conversion is required from a voltage representation of the amplifier output signal to a current representation required by the summing elements as explained above, this conversion may be performed by resistors 103 and 106. In the alternative, transconductance stages could be provided.

Figure 2:
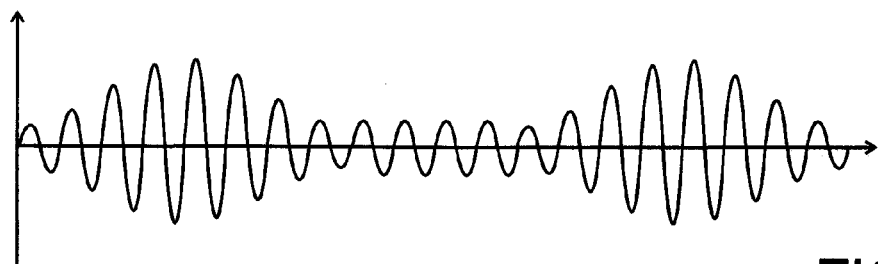
FIG. 2 shows an input signal of the asynchronous delta-sigma modulator.
Figure 3:
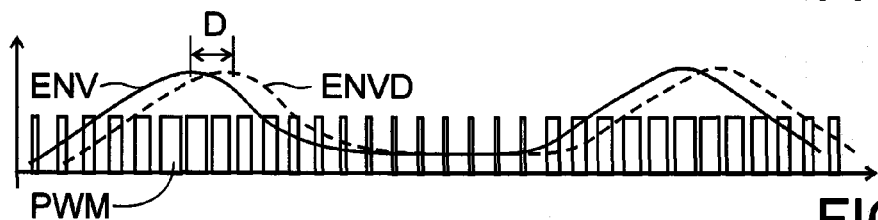
FIG. 3 shows various signals appearing in an envelope path comprising a pulse-width modulation.

FIGS. 2 to 6 show several signals as they may appear (except for the signal shown in FIG. 4) in the delta-sigma modulator of FIG. 1. FIG. 2 shows an exemplary input signal for the delta-sigma modulator 100. The input signal can be described as an amplitude modulated sine wave. FIG. 3 shows three signals as they may be observed in the envelope path 112. The envelope signal ENV is obtained by determining the peaks of the sine wave of FIG. 2 and connecting them in order to obtain a smooth signal. The envelope signal ENV is then pulse-width modulated by an appropriate implementation of a part of supply modulator 111, i.e. a pulse-width modulator. The resulting pulse-width modulated signal is shown in FIG. 3 and designated by PWM. Based on the pulse-width modulated signal PWM the supply voltage modulator creates an amplitude signal or delayed envelope signal ENVD (dashed line in FIG. 3) which substantially corresponds to the envelope signal ENV. However, the delayed envelope signal ENVD may be scaled with respect to the envelope signal. The delay between the envelope signal ENV and the delayed envelope signal ENVD is designated by D in FIG. 3.

Figure 4:
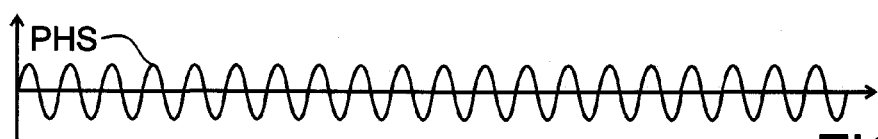
FIG. 4 shows a phase signal corresponding to the input signal of FIG. 2.
Figure 5:
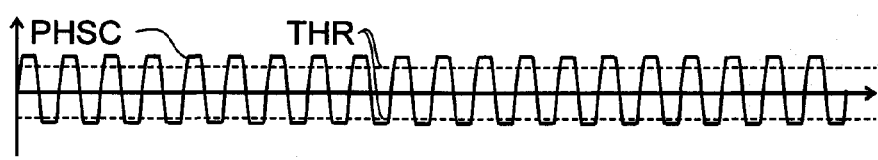
FIG. 5 shows an amplitude limited phase signal.

FIG. 4 shows the phase PHS of the input signal of FIG. 2. The phase corresponds to the sine wave portion of the input signal without any amplitude modulation. Note that the phase PHS shown in FIG. 4 is idealized and shown for illustrative purposes, only. Usually the ideal phase PHS cannot be observed within delta-sigma modulator 100. FIG. 5, on the other hand, shows a clipped phase signal PHSC as an approximation of the phase PHS that can be produced and observed within delta-sigma modulator 100. Such a clipped signal can be obtained by means of a limiting amplifier, a phase-locked VCO, a injection-locked VCO, or any other limiting circuit. Also indicated in FIG. 4 are upper and lower switching thresholds THR of amplifier 115. Depending on the type of amplifier used, amplifier 115 operates in a highly efficient mode when its input signal is outside of the band between upper and lower thresholds THR.

Figure 6:
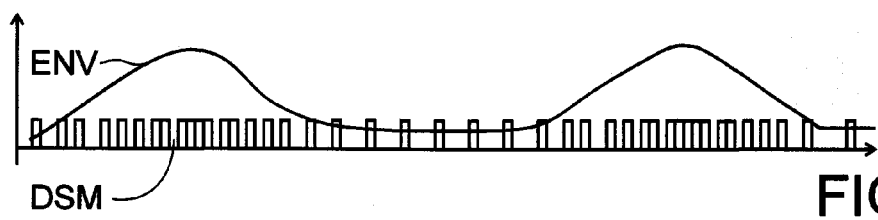
FIG. 6 shows various signals appearing in an envelope path comprising a delta-sigma modulation.

FIG. 6 is similar to FIG. 3 with the difference that FIG. 6 shows a delta-sigma modulated signal DSM that is produced within supply voltage modulator 111 instead of the pulse-width modulated signal PWM shown in FIG. 3.

Figure 7:
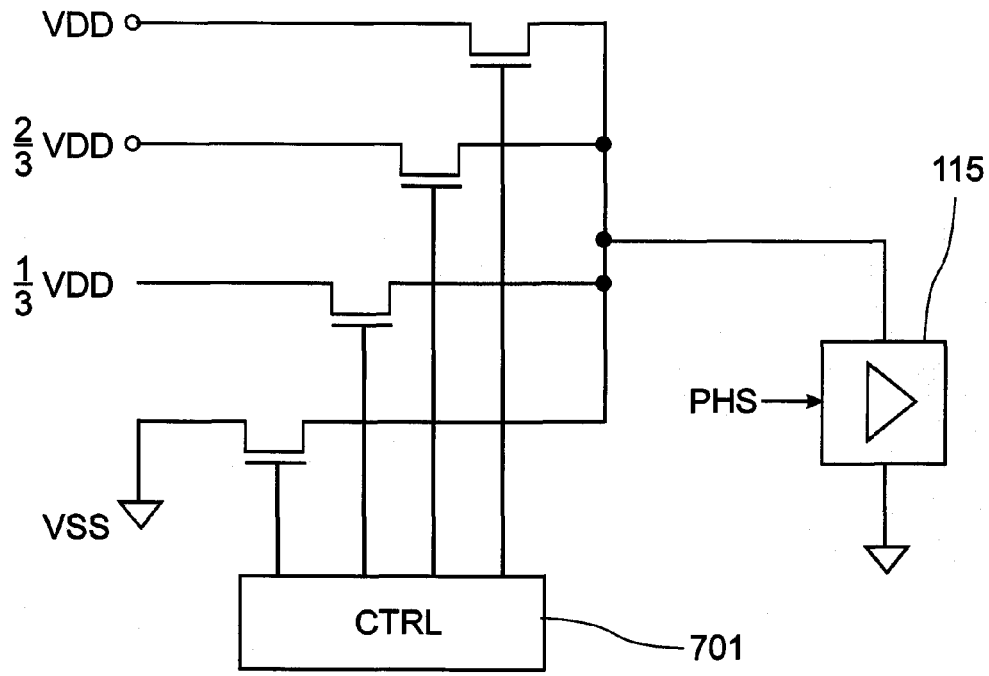
FIG. 7 shows, in a schematic manner, a first variant of a supply voltage modulator for an amplifier of an asynchronous delta-sigma modulator.

FIG. 7 shows a possible implementation of a supply modulator 111 that is capable of providing four discrete levels of supply voltage to the amplifier 115. The supply modulator comprises four switches which are field effect transistors in the case illustrated in FIG. 7. Each of the switches is connected, at one side, to the supply voltage input port of amplifier 115. Another input for amplifier 115 is provided by the approximated phase signal PHSC. At their respective other side, each switch is connected to a different electrical potential. The upper switch is connected to an electrical potential that has a voltage to ground $V_{SS}$ equal to $V_{DD}$. The second switch from the top is connected to an electrical potential that has a voltage to ground $V_{SS}$ equal to $\frac{2}{3} V_{DD}$. The third switch from the top is connected to an electrical potential that has a voltage to ground $V_{SS}$ equal to $\frac{1}{3} V_{DD}$. And the lower switch is connected to ground equal $V_{SS}$. The four switches are controlled by a control unit 701 which analyzes the envelope signal or decodes a pulse-width modulated signal or a delta-sigma modulated signal. The control signals could be derived directly from the peak detector 110 which may provide a 2-bit signal depending on the determined envelope value. Diodes may be required at the outputs of the transistors.

Figure 8:
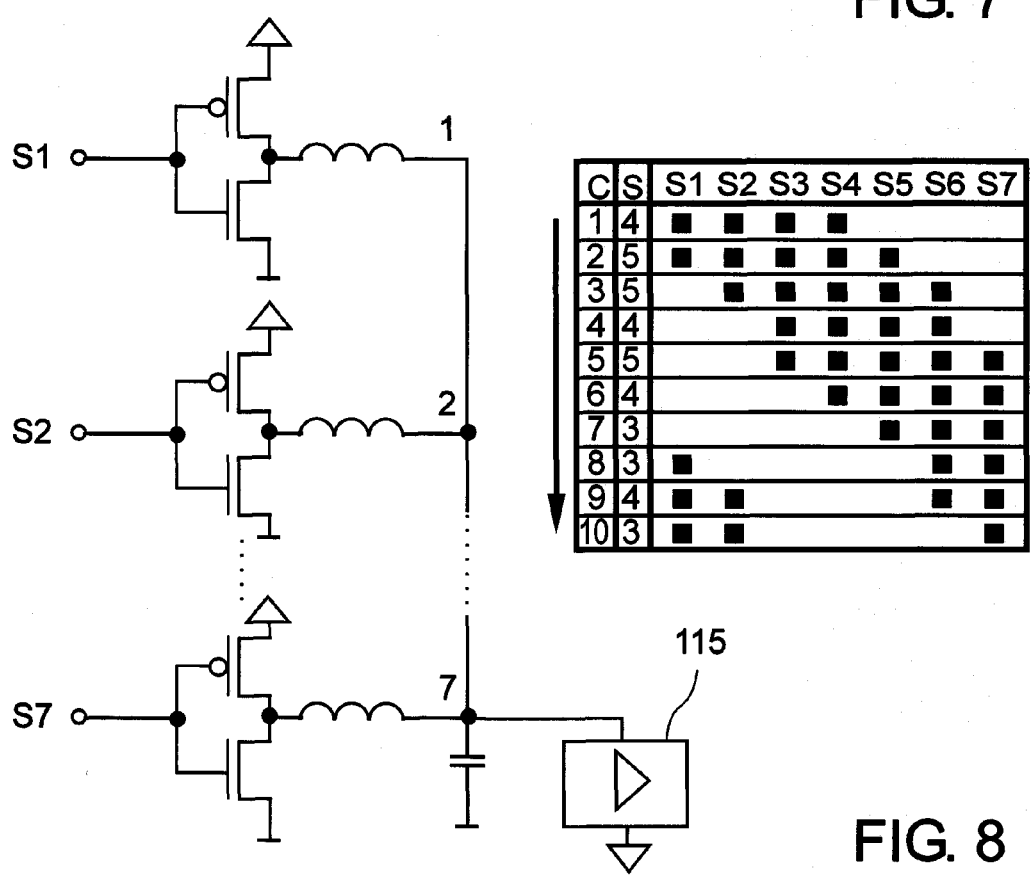
FIG. 8 shows, in a schematic manner, a second variant of a supply voltage modulator for an amplifier of an asynchronous delta-sigma modulator and a corresponding switching schedule.

FIG. 8 shows another implementation of a supply modulator 111 as a DC-DC converter with low delay, moderate switching frequency and high bandwidth. The DC-DC converter has seven double throw switches. Each of the switches could be a CMOS inverter. One of the transistors within each transistor pair is connected to a high voltage potential, such as $V_{DD}$. The other transistor is connected to a low voltage potential, such as $V_{SS}$. Each of the switches is controlled by a respective control signal S1, S2 . . . S7. The node between the two transistors of each transistor pair is pulled to the high voltage potential or to the low voltage potential, depending on the respective input signal S1 . . . S7 of the switch in question. A respective inductor connects the node between the two transistors of each transistor pair with the supply voltage input of amplifier 115. A capacitor is provided between the supply voltage input of amplifier 115 and ground. The switching signals S1 . . . S7 can be derived from a desired input signal for the voltage level according to the coding scheme on the right of FIG. 8. The column C indicates the cycle number. Column S contains the desired supply voltage signal which may be any integer number between 0 and 7. The columns 51 to S7 contain the switching signals 51 to S7. A black square indicates that the switching signal is high, whereas a blank field indicates that the switching signal is low. The coding scheme cycles the switches to be switched on and off in almost every cycle so that every switch is switched at much lower frequency, e.g. approximately every 3.5 cycles. Note that this is true for desired input signals that remain constant or vary relatively slowly, i.e. up/down by one or two discretization levels per cycle. The desired supply voltage signal S can be derived directly from the peak detector which may indeed provide a three bit signal indicating the input signal's relation (greater than/smaller than) to the different voltage thresholds. The term "cycling switching priority schedule" indicates that the selection of the switch to be switched on or off during a given cycle depends on the switching priority that is attributed to the particular switch for that given cycle. A high switching priority means that the particular switch is very likely to be switched during that cycle. The switching priority cycles so that a first switch may have the highest switching priority in a given cycle and a somewhat lower switching priority in the subsequent cycle. Instead, a second switch has the highest switching priority in the subsequent cycle.

Figure 9:
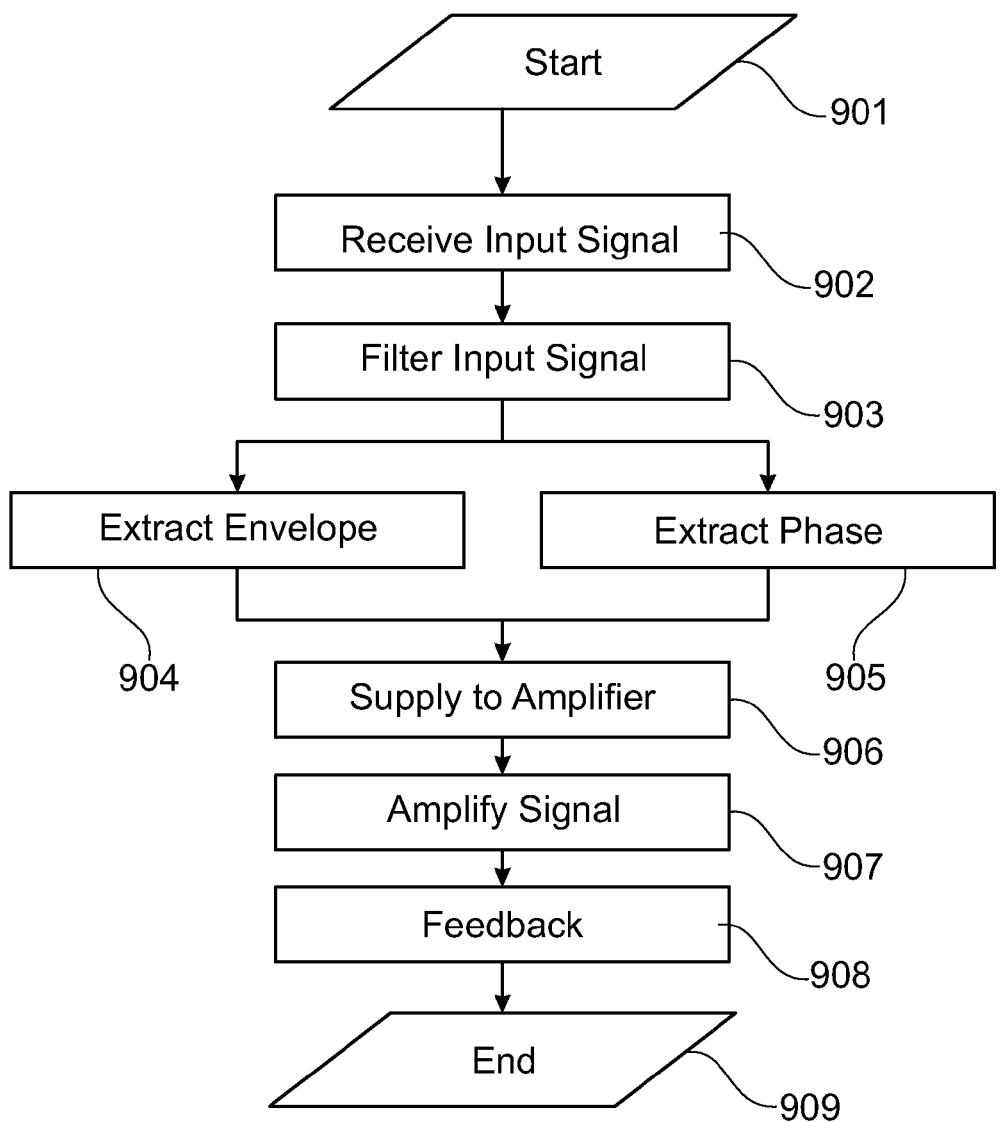
FIG. 9 shows a schematic flow chart of a method according to the teaching disclosed herein.

FIG. 9 shows a schematic flow chart for method for asynchronous delta-sigma modulation according to the teachings of this disclosure. Asynchronous delta-sigma modulation is a continuous process so that the concept of iterations and stepwise processing is not readily applicable. Therefore, the flow chart does not necessarily show a chronological order of different actions to be performed, but rather the various sequential forms of signal processing that a piece of information provided with the input signal undergoes. FIG. 9 shows the method of asynchronous delta-sigma modulation exemplary as a sub-routine that can be executed in a repeating manner.

The sub-routine shown in FIG. 9 starting at 901 comprises a first action 902 of receiving an input signal. The input signal is then filtered in action 903 to obtain a filtered signal. Signal processing then splits up in two branches. In a first branch, an envelope is extracted from the filtered signal in action 904 in order to obtain an envelope signal. In a second branch, a phase is extracted from the filtered signal in action 905 in order to obtain a phase signal. The envelope signal and the phase signal are supplied to an amplifier 115 (see FIG. 1) in action 906, and more particularly to an envelope input port and a phase input port of the amplifier, respectively. The amplifier issues an amplifier output signal in action 907. The amplifier output signal is based on the envelope signal and the phase signal. In action 908, the amplifier output signal is fed back to the filter (102, 104, 105, 107).

While various embodiments of what is taught have been described above, it should be understood that they have been presented by way of example, and not limitation. It will be apparent to persons skilled in the relevant arts that various changes in form and detail can be made therein without departing from the scope of what is taught. For example, any bipolar transistors depicted in the drawings and/or described in the text could be field effect transistors, and vice versa. The resonators need not be a LC-type resonator, but also any other type of suitable resonator, such as a tank, a transmission line resonator, a cavity resonator or a surface wave resonator. In addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the disclosed apparatus, method or computer-program product may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the disclosed apparatus, method or computer-program product should not be limited by any of the above-described exemplary embodiments, but should be defined only in accordance with the following claims and their equivalents.

| List of reference signs: | |
|---|---|
| 100 | asynchronous delta-sigma modulator |
| 101 | input port |
| 102 | first summing element |
| 103 | first resistor in feedback path |
| 104 | first resonator |
| 105 | second summing element |
| 106 | second resistor in feedback path |
| 107 | second resonator |
| 108 | first delay element |
| 110 | peak detector |
| 111 | supply modulator |
| 112 | envelope path |
| 113 | phase extraction circuit |
| 114 | second delay element |
| 115 | power amplifier |
| 116 | phase path |
| 117 | bandpass filter |
| 118 | feedback path |
| 701 | DC-to-DC converter controller |
| 901 | start of sub-procedure |
| 902 | action: receive input signal |
| 903 | action: filter input signal |
| 904 | action: extract envelope from filtered signal |
| 905 | action: process (extract) phase of filtered signal |
| 906 | action: supply envelope and phase to amplifier |
| 907 | action: amplifier issues amplifier output signal |
| 908 | action: feedback of amplifier output signal to filter |
| 909 | end of sub-procedure |
| C | cycle |
| D | delay |
| DSM | delta-sigma modulated envelope signal |
| ENV | envelope |
| ENVD | delayed enveloped signal |
| PHS | phase |
| PHSC | clipped phase signal |
| PWM | pulse-width modulated envelope signal |
| S | desired supply voltage signal |

-continued

| List of reference signs: | |
|---|---|
| S1 | switching signal for CMOS pair 1 |
| S2 | switching signal for CMOS pair 2 |
| S7 | switching signal for CMOS pair 7 |
| THR | switching thresholds of power amplifier |
| VDD | drain potential |
| VSS | source potential |

The invention claimed is:

1. An asynchronous delta-sigma modulator comprising an input port for receiving an analog input signal,
at least one summing element that receives the analog input signal from the input port and outputs at least one analog summation output;
at least a filter that receives the at least one analog summation output and issues an analog filtered signal,
an envelope path that processes an envelope from the analog filtered signal and issues an envelope signal,
a phase path that processes a phase from the analog filtered signal and issues a phase signal,
an amplifier that comprises an envelope input port for said envelope signal and a phase input port for said phase signal, wherein the amplifier issues an amplifier output signal based on said envelope signal and said phase signal, and
a feedback path that conveys the amplifier output signal to the at least one summing element.

2. The asynchronous delta-sigma modulator according to claim 1, wherein the envelope path comprises a supply voltage modulator that provides a supply voltage for the amplifier.

3. The asynchronous delta-sigma modulator according to claim 2, wherein the supply voltage modulator comprises one or more selected from the group consisting of:
a plurality of switches connected to different supply voltage levels,
a pulse-width modulated DC-to-DC converter,
a pulse-width modulator connected directly to the amplifier,
a delta-sigma modulator connected directly to the amplifier,
a delta-sigma modulated DC-to-DC converter,
a DC-to-DC converter having a plurality of switches connected to a master supply voltage, wherein the switches are switched according to a cycling switching priority schedule.

4. The asynchronous delta-sigma modulator according to claim 1, wherein the amplifier comprises a plurality of transistors connected to different source voltages and a control logic that receives the envelope signal from the envelope path and switches a selected transistor among the plurality of transistors so that the amplifier output signal has an instantaneous amplitude that substantially corresponds to an instantaneous value of the envelope signal.

5. The asynchronous delta-sigma modulator according to claim 1, wherein the amplifier comprises a class-C amplifier, a class-D amplifier, a class-E amplifier, or a class-F amplifier.

6. The asynchronous delta-sigma modulator according to claim 1, wherein the phase path comprises one or more selected from the group consisting of:
a hard limiting amplifier;
a soft limiting amplifier;
a voltage controlled oscillator;
a linear amplifier;
a pre-distorter compensating for non-linear behaviour of the amplifier and/or the supply modulator.

7. The asynchronous delta-sigma modulator according to claim 1, wherein the phase path comprises a phase signal delay element.

8. The asynchronous delta-sigma modulator according to claim 1, wherein the filter comprises a voltage-to-current converter for converting the amplifier output signal conveyed via the feedback path from a voltage representation to a current representation.

9. The asynchronous delta-sigma modulator according to claim 1, further comprising a delay element for delaying the analog filtered signal.

10. The asynchronous delta-sigma modulator according to claim 1, wherein the amplifier is a power amplifier.

11. A radio-frequency transmitter circuit, comprising an asynchronous delta-sigma modulator comprising
an input port for receiving an analog input signal,
at least one summing element that receives the analog input signal from the input port and outputs at east one analog summation output;
at least a filter that receives the at least one analogy summation output and issues an analog filtered signal,
an envelope path that processes an envelope from the analog filtered signal and issues an envelope signal,
a phase path that processes a phase from the analog filtered signal and issues a phase signal,
an amplifier that comprises an envelope input port for said envelope signal and a phase input port for said phase signal, wherein the amplifier issues an amplifier output signal based on said envelope signal and said phase signal, and
a feedback path that conveys the amplifier output signal to the at least one summing element.

12. A method for asynchronous delta-sigma modulation of an input analog signal, comprising:
receiving the analog input signal,
passing the analog input signal to at least one summing element for outputting at least one analog summation output;
filtering the at least one analog summation output by at least one filter to obtain an analog filtered signal,
extracting an envelope from the analog filtered signal to obtain an envelope signal,
processing a phase from the analog filtered signal to obtain a phase signal, supplying the envelope signal to an envelope input port of an amplifier and the phase signal to an phase input port of said amplifier,
issuing an amplifier output signal based on said envelope signal and said phase signal,
feeding the amplifier output signal back to the at least one summing element.

13. The method of claim 12, wherein said envelope input port of said amplifier is a supply voltage input port for the amplifier, and wherein supplying said envelope signal to the supply voltage port comprises modulating the envelope signal to obtain a supply voltage for the amplifier.

14. The method of claim 13, wherein modulating the envelope signal to obtain the supply voltage for the amplifier comprises one or more selected from the group consisting of:
selecting a supply voltage level out of a plurality of supply voltage levels and connecting the supply voltage level to the supply voltage port of the amplifier,
pulse-width modulating the envelope signal,
delta-sigma modulating the envelope signal,
DC-to-DC converting the envelope signal by a plurality of switches connected to a master supply voltage, wherein the switches are switched according to a cycling priority schedule.

15. The method of claim 13, wherein processing the phase comprises one or more selected from the group consisting of:
hard limited amplifying the analog filtered signal,
soft limited amplifying the analog filtered signal,
employing a voltage controlled oscillator,
linearly amplifying the analog filtered signal,
pre-distorting the analog filtered signal.

16. A computer program product embodied on a non-volatile computer-readable medium and comprising instructions that enable a processor to carry out a method for asynchronous delta-sigma modulation of an analog input signal comprising:
receiving the analog input signal,
passing the analog input signal to at least one summing element for outputting at least one analog summation output;
filtering the at least one analog summation output by at least one filter to obtain an analog filtered signal,
extracting an envelope from the analog filtered signal to obtain an envelope signal,
processing a phase from the analog filtered signal to obtain a phase signal, supplying the envelope signal to an envelope input port of an amplifier and the phase signal to an phase input port of said amplifier,
issuing an amplifier output signal based on said envelope signal and said phase signal,
feeding the amplifier output signal back to the at least one summing element.

* * * * *

UNITED STATES PATENT AND TRADEMARK OFFICE
CERTIFICATE OF CORRECTION

| | |
|---|---|
| PATENT NO. | : 8,385,468 B2 |
| APPLICATION NO. | : 12/566071 |
| DATED | : February 26, 2013 |
| INVENTOR(S) | : Udo Karthaus et al. |

It is certified that error appears in the above-identified patent and that said Letters Patent is hereby corrected as shown below:

In the Specifications

Column 9, line 67, "51" should read -- S1 --;

Column 10, line 1, "51" should read -- S1 --;

In the Claims

Claim 11, line 5, "outputs at east one analog"
       should read -- outputs at least one analog --;

Claim 11, line 7, "the at least one analogy"
       should read -- the at least one analog --.

Signed and Sealed this
Fourth Day of June, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,385,468 B2  
APPLICATION NO. : 12/566071  
DATED : February 26, 2013  
INVENTOR(S) : Udo Karthaus et al.

Page 1 of 1

It is certified that error appears in the above-identified patent and that said Letters Patent is hereby corrected as shown below:

In the Specifications

Column 9, line 67, "51" should read -- S1 --;

Column 10, line 1, "51" should read -- S1 --;

In the Claims

Column 13, line 19 (Claim 11, line 5) "outputs at east one analog"
should read -- outputs at least one analog --;

Column 13, line 21 (Claim 11, line 7) "the at least one analogy"
should read -- the at least one analog --.

This certificate supersedes the Certificate of Correction issued June 4, 2013.

Signed and Sealed this
Second Day of July, 2013

Teresa Stanek Rea
*Acting Director of the United States Patent and Trademark Office*